(12) United States Patent
Neddermeyer, III et al.

(10) Patent No.: US 8,692,398 B2
(45) Date of Patent: Apr. 8, 2014

(54) MOBILE ENVIRONMENT-CONTROLLED UNIT HAVING A MAGNETIC SENSOR FOR A HIGH-VOLTAGE ALTERNATING CURRENT BUS

(75) Inventors: Robert N. Neddermeyer, III, Eagan, MN (US); Gregory R. Truckenbrod, Minneapolis, MN (US); Matthew S. Nelson, Cottage Grove, MN (US); Ashok Muralidhar, Eagan, MN (US)

(73) Assignee: Thermo King Corporation, Minneapolis, MN (US)

( * ) Notice: Subject to any disclaimer, the term of this patent is extended or adjusted under 35 U.S.C. 154(b) by 176 days.

(21) Appl. No.: 13/435,759

(22) Filed: Mar. 30, 2012

(65) Prior Publication Data

US 2013/0257048 A1   Oct. 3, 2013

(51) Int. Cl.
   *H02P 9/04*   (2006.01)
(52) U.S. Cl.
   USPC .................................................. 290/5
(58) Field of Classification Search
   USPC .............................. 290/5–6, 12, 49
   See application file for complete search history.

(56) References Cited

U.S. PATENT DOCUMENTS

| | | | |
|---|---|---|---|
| 4,870,527 A | 9/1989 | Zaleski | |
| 5,274,317 A | 12/1993 | Utley et al. | |
| 5,477,163 A | 12/1995 | Kliman | |
| 5,874,818 A | 2/1999 | Schuurman | |
| 5,880,533 A | 3/1999 | Arai et al. | |
| 6,459,557 B1 | 10/2002 | Haensgen et al. | |
| 6,891,343 B2 * | 5/2005 | Petersen | 318/400.11 |
| 6,933,690 B2 | 8/2005 | Yamamoto | |
| 7,075,267 B1 | 7/2006 | Cheng | |
| 7,254,004 B2 | 8/2007 | Mladenik et al. | |
| 7,301,739 B2 | 11/2007 | Hamer | |
| 7,672,099 B2 | 3/2010 | Bax et al. | |
| 7,808,200 B2 | 10/2010 | Liu et al. | |
| 7,898,210 B2 | 3/2011 | Hsieh et al. | |
| 2003/0034751 A1 * | 2/2003 | Walters | 318/445 |
| 2005/0046395 A1 | 3/2005 | Aoyama | |
| 2010/0141192 A1 | 6/2010 | Paintz et al. | |
| 2010/0219781 A1 | 9/2010 | Kuwamura | |
| 2011/0149446 A1 | 6/2011 | Moreira | |
| 2011/0170223 A1 | 7/2011 | DiMarco et al. | |
| 2011/0216450 A1 | 9/2011 | Cheng et al. | |
| 2011/0228433 A1 | 9/2011 | Tsai et al. | |
| 2011/0257934 A1 | 10/2011 | Dimino et al. | |
| 2012/0031132 A1 | 2/2012 | Ikemiya et al. | |
| 2012/0055180 A1 | 3/2012 | Larson et al. | |

OTHER PUBLICATIONS

International Search Report and Written Opinion for Application No. PCT/US2013/031188 dated Jun. 27, 2013 (9 pages).

* cited by examiner

*Primary Examiner* — Jean F Duverne
(74) *Attorney, Agent, or Firm* — Michael Best & Friedrich LLP

(57) ABSTRACT

The invention provides a mobile environment-controlled unit having a chassis, a compartment supported by the chassis, and an environmental-control system in environmental communication with the compartment. The environmental-control system includes a multiphase alternator powered by an internal combustion engine and supplies electrical power for the environmental-control system. The alternator has a first phase winding to generate a first high-voltage alternating phase current and a second phase winding to generate a second high-voltage alternating phase current. The environmental-control system further includes a magnetic sensor including a core, and a magnetic sensing device interconnected to the core and providing an output based on a sensed electromagnetic parameter.

20 Claims, 6 Drawing Sheets

MOBILE ENVIRONMENT-CONTROLLED UNIT HAVING A MAGNETIC SENSOR FOR A HIGH-VOLTAGE ALTERNATING CURRENT BUS

BACKGROUND

Embodiments of the invention relate to a mobile environment-controlled unit, such as an over-the-road compartment trailer, having an environmental-control system, such as a refrigeration unit, powered by an alternator and having a high-voltage alternating current (AC) bus. Other embodiments of the invention relate to generators having a high-voltage bus.

Some mobile environment-controlled units include a battery charger with an embedded processor to communicate diagnostic health information to the controller of the unit. U.S. patent application Ser. No. 12/847,292, filed Jul. 30, 2010, for example, discloses exemplary units having a battery charger with an embedded processor. However, many mobile environment-controlled units do not include a battery charger with an embedded process. Moreover, many systems neglect to directly monitor bus health of the alternator, and instead, identify bus faults via secondary component misbehavior.

SUMMARY

The invention provides another solution for sensing and providing diagnostic information regarding a high-voltage AC bus of an alternator.

In one embodiment, the invention provides a mobile environment-controlled unit having a chassis, a compartment supported by the chassis, and an environmental-control system in environmental communication with the compartment. The environmental-control system is configured to control an environmental parameter of the compartment. The environmental-control system includes a multiphase alternator powered by an internal combustion engine and supplies electrical power for the environmental-control system. The alternator has a first phase winding to generate a first high-voltage alternating phase current and a second phase winding to generate a second high-voltage alternating phase current. The environmental-control system further includes a magnetic sensor including a core, and a magnetic sensing device interconnected to the core and providing an output based on a sensed electromagnetic parameter. A first conductor leading from the first phase winding is wound around the core in a first direction for a first number of turns, and a second conductor leading from the second phase winding is wound around the core in the first direction for a second number of turns. The second number of turns is different from the first number of turns. The environmental-control system also includes a controller coupled to the magnetic sensing device and configured to control the environmental-control system based on the output of the magnetic sensing device.

It is also envisioned that the invention is not limited to mobile-environment-controlled units. For example, the invention can be implemented in vehicles and generators having an alternator and a high-voltage AC bus.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In one implementation, a mobile unit (e.g., a vehicle or a mobile environment-controlled unit) has a multiphase alternator, such as a three-phase alternator. The unit incorporates a single Hall Effect current sensor to monitor all three phases of the high-voltage AC bus from the alternator. Each of the phases are routed through the sensor with a differing turn ratio, and as such do not cancel. The output of the sensor is an analog signal, which is then analyzed in terms of amplitude, frequency, and amplitude/frequency ratio to determine bus loading and identify fault conditions.

Figure 1:
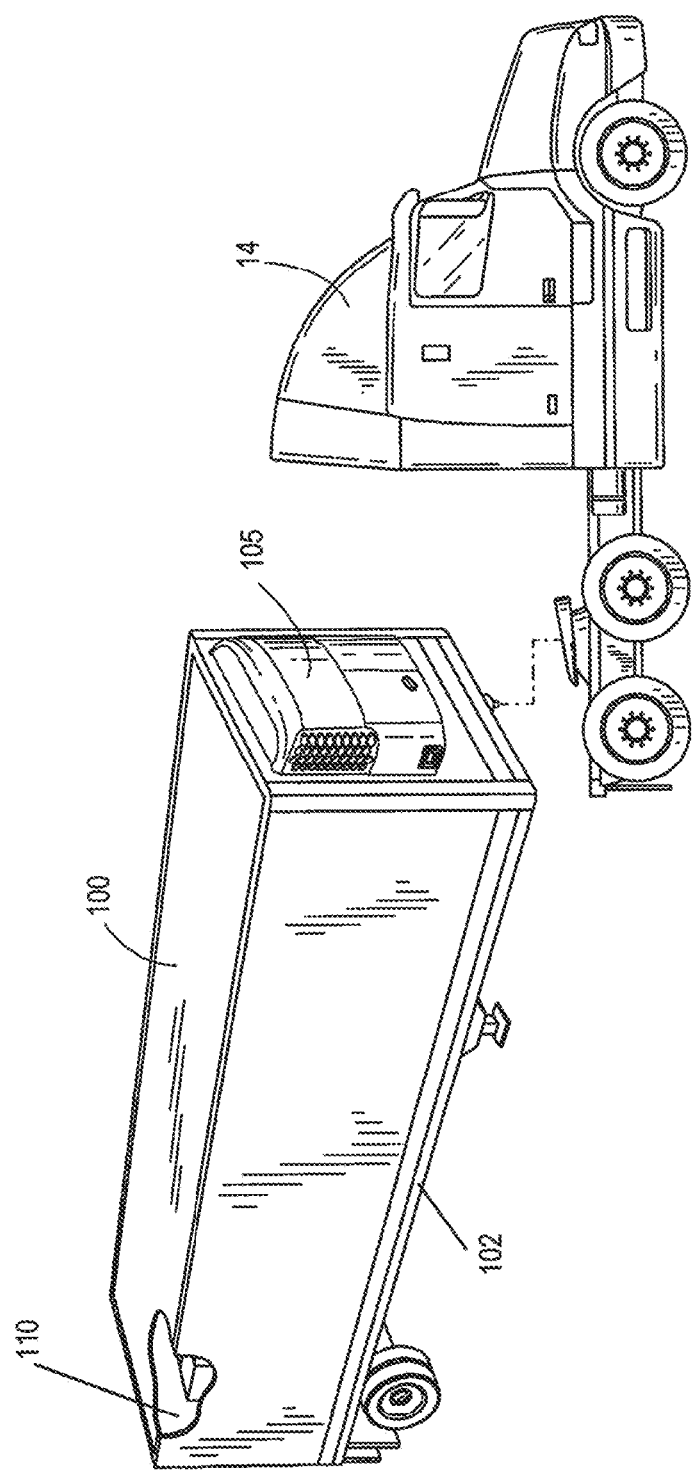
FIG. 1 is a perspective view of an over-the-road tractor and semi trailer.

Embodiments of the invention relate to a mobile environment-controlled unit having an environmental-control system and a compartment. Exemplary mobile environment-controlled units include an over-the-road trailer, over-the-road truck body, bus, transport container, and railway car. The compartment can take the form of multiple compartments or have multiple zones. An exemplary environmental-control system includes one or more of a refrigeration system, heating system, humidity system, and air-quality system. An even more specific exemplarily system includes a heating, ventilating, air conditioning, and refrigeration (HVACR) system. In the specific example discussed below, the environment-controlled unit is an over-the-road refrigerated semi trailer 100 (FIG. 1) having a chassis 102 supporting (or forming) a single compartment 110 cooled by a refrigeration unit 105. The chassis 102 also supports the refrigeration unit 105. Other embodiments of the invention relate to a vehicle having an alternator and a high-voltage AC bus, or even a generator having a high-voltage AC bus. Exemplary vehicles include automobile, marine, and aerospace vehicles.

Figure 2:
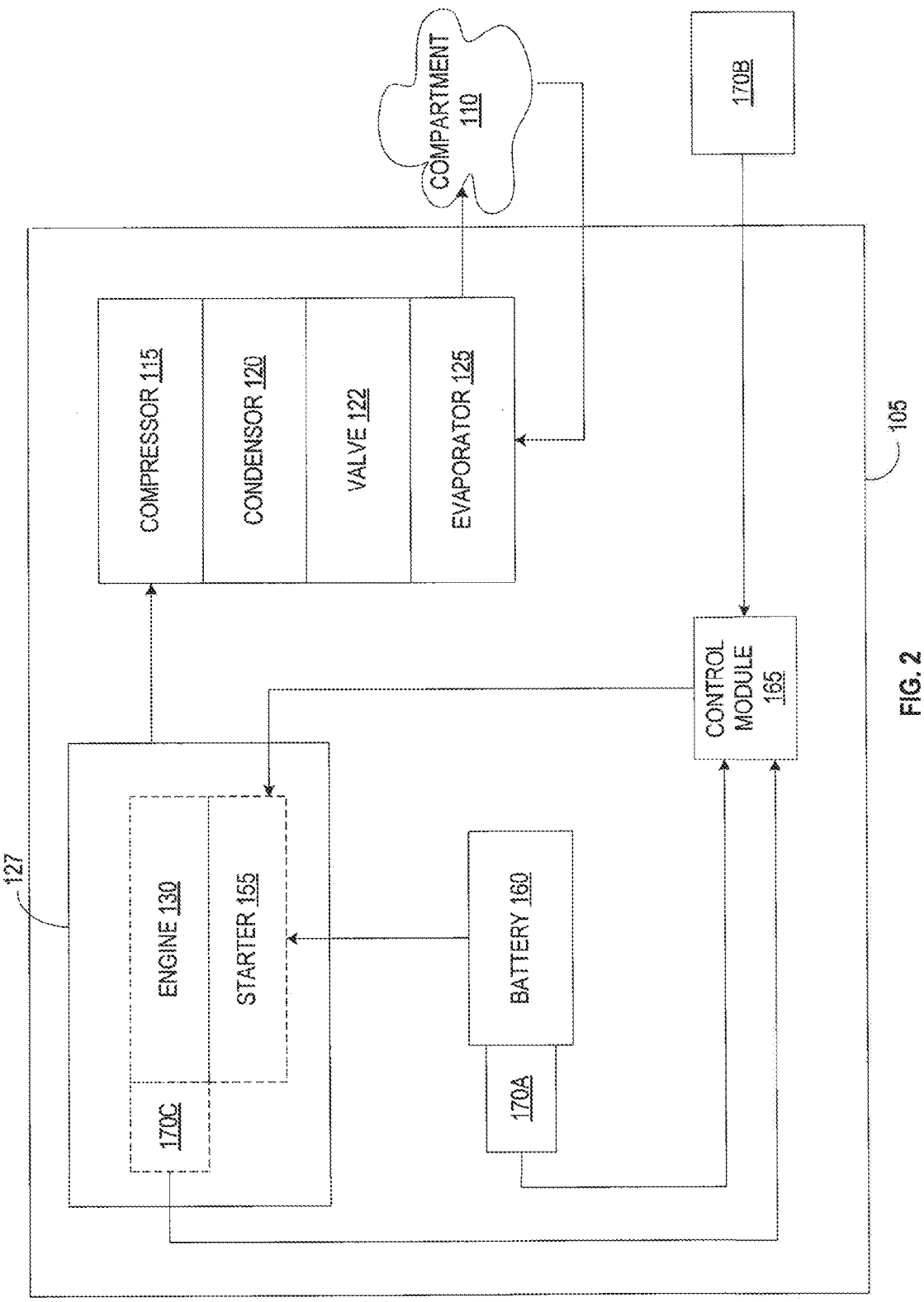
FIG. 2 is a block diagram of a refrigeration unit of the semi trailer of FIG. 1.

The refrigeration unit 105 of the specific example herein includes conventional refrigeration elements, such as a compressor 115 (FIG. 2), condenser 120, expansion valve 122, and evaporator 125. The refrigeration unit 105 is powered from an internal combustion engine 130. For example, the compressor 125 can be driven by an electronically-controlled motor powered by a belt-driven alternator having a governed internal combustion engine 130.

For the described construction, the refrigeration unit 105 is controlled in a "cycle" mode, which starts the engine 130 when a parameter is out of range and stops the engine 130 when the parameter is within range. The parameter may be, for example, battery voltage, compartment temperature, compartment humidity, compartment air quality, or engine temperature. In one specific example, the engine 130 starts after the compartment temperature rises above a first temperature value and stops after the compartment temperature falls below a second temperature value, which may be the same as the first temperature value.

Referring again to FIG. 2, a starter 155 is powered by a battery 160 and is controlled in response to a signal from a control module 165. The control module 165 also receives a signal from a sensor 170. The signal has a value having a relation to the sensed parameter. For example, the sensor 170A can be a voltage sensor and the signal has a relation to the voltage of the battery. As another example, the sensor 170B can be a temperature sensor and the signal has a relation to the temperature of the compartment 110. In another example, the sensor 1700 can be a high-voltage AC bus sensor and the signal has a relation to an electrical parameter of the high-voltage AC bus.

Before proceeding further, it should be understood that while the control module 165 is discussed herein as a single module, the control module can comprise multiple modules.

Figure 3:
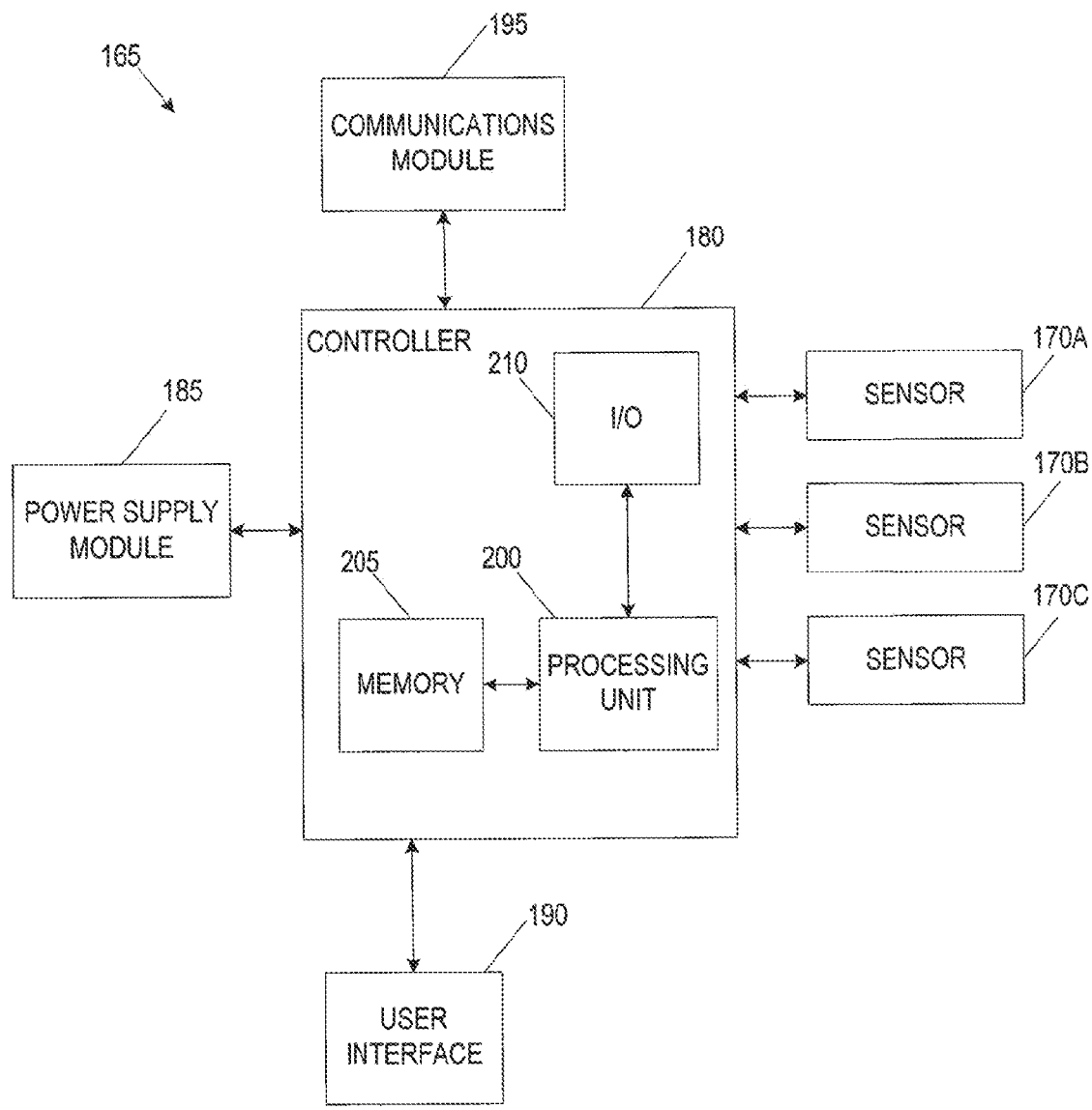
FIG. 3 is a block diagram of a control module of the refrigeration of FIG. 2.

The control module 165 includes, among other things, a controller 180 (FIG. 3), a power supply module 185, a user interface 190, and a communications module 195. The controller 180 includes combinations of software and hardware that are operable to, among other things, control the operation of the refrigeration unit 105. In one construction, the controller 180 includes a printed circuit board ("PCB") that is populated with a plurality of electrical and electronic components that provide power, operational control, and protection to the control module 165. In some constructions, the PCB includes, for example, a processing unit 200 (e.g., a microprocessor, a microcontroller, digital signal processor, or another suitable programmable device), a memory 205, and a bus. The bus connects various components of the PCB including the memory 205 to the processing unit 200. The memory 205 includes, for example, a read-only memory ("ROM"), a random access memory ("RAM"), an electrically erasable programmable read-only memory ("EEPROM"), a flash memory, a hard disk, or another suitable magnetic, optical, physical, or electronic memory device. The processing unit 200 is connected to the memory 205 and executes software that is capable of being stored in the RAM (e.g., during execution), the ROM (e.g., on a generally permanent basis), or another non-transitory computer readable medium such as another memory or a disc. Additionally or alternatively, the memory 205 is included in the processing unit 200. The controller 180 also includes an input/output ("I/O") system 210 that includes routines for transferring information between components within the controller 180 and other components of the control module 165. For example, the communications module 195 is configured to provide communication between the control module 180 and one or more additional devices within the trailer 100 or tractor 14 or external to the trailer 100 or tractor 14.

Software included in the implementation of the control module 165 is stored in the memory 205 of the controller 180. The software includes, for example, firmware, one or more applications, program data, one or more program modules, and other executable instructions. The controller 180 is configured to retrieve from memory and execute, among other things, instructions related to the operation and control of the refrigeration unit 105. For example, the controller 180 is configured to execute instructions retrieved from memory 205 for monitoring the temperature within the compartment 110 and for controlling the refrigeration unit 105 to control the temperature within the compartment 110. In other constructions, the controller 180 or external device includes additional, fewer, or different components.

The PCB also includes, among other things, a plurality of additional passive and active components such as resistors, capacitors, inductors, integrated circuits, and amplifiers. These components are arranged and connected to provide a plurality of electrical functions to the PCB including, among other things, filtering, signal conditioning, or voltage regulation. For descriptive purposes, the PCB and the electrical components populated on the PCB are collectively referred to as the controller 180.

The user interface 190 is included to control the control module 165 or the operation of the refrigeration unit 105 as a whole. The user interface 190 is operably coupled to the controller 180 to control, for example, setting the operation of the refrigeration unit 105 and communicating faults of the refrigeration unit 105. The user interface 190 can include combinations of digital and analog input/output devices required to achieve a desired level of interfacing with an operator. For example, the user interface 190 can include a computing device having a display and input devices, a touch-screen display, a plurality of knobs, dials, switches, buttons, faders, or the like.

Figure 4:
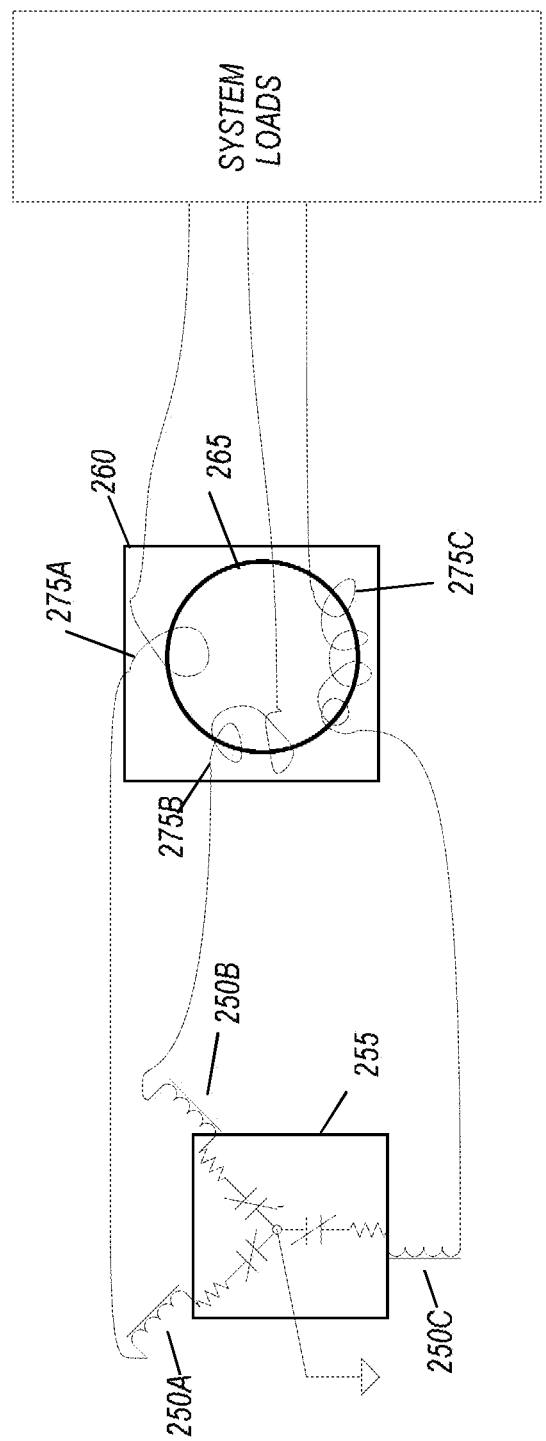
FIG. 4 is an electrical schematic of a portion of the refrigeration unit of FIG. 2.
Figure 5:
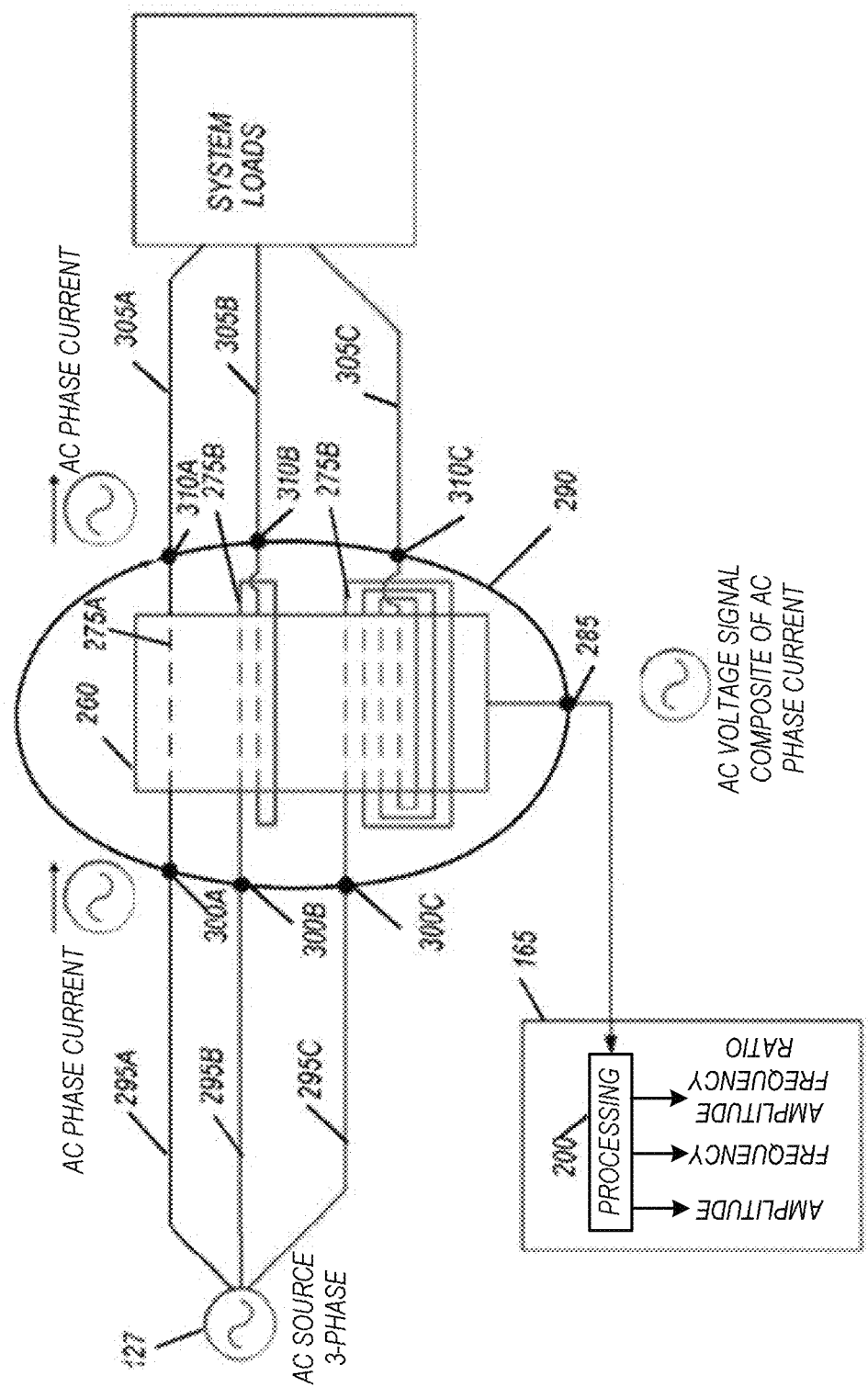
FIG. 5 is a block diagram of a portion of the refrigeration unit of FIG. 2.
Figure 6:
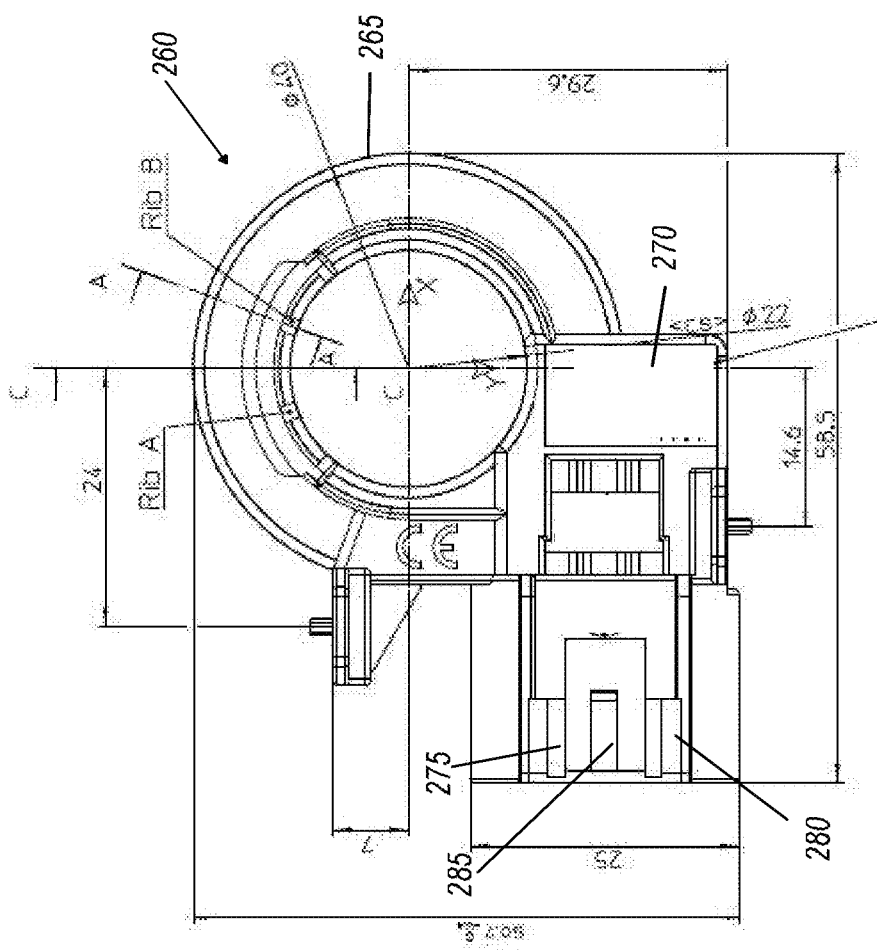
FIG. 6 is a side view of a Hall-Effect Sensor.

Turning now to FIGS. 4-6, windings 250 of the alternator 127 are schematically represented. The windings 250 are configured in a wye configuration providing three phase electrical power. However, other multiphase winding configurations, such as a three-phase delta configuration, are possible. Also shown as part of the alternator 127 is a wye point protection device 255. The electrical power from the windings is provided to the system loads of the refrigeration unit 105, as discussed above and as commonly known. However, electrically after the alternator 127 and before use of the electrical power by the loads, a magnetic field current sensor, such as Hall Effect sensor 260, or a magnetic flux sensor, such as a fluxgate sensor, senses the generated phase current from the windings 250.

The Hall Effect sensor 260 can be an open-loop or closed-loop sensor. The sensor 260 includes a core 265 and a Hall Effect device 270 (FIG. 6) interconnected with the core 360. A first conductor 275A leading from a first phase 250A is wound around the core 265 a first number of turns, a second conductor 275B leading from a second phase 250B is wound around the core 265 a second number of turns, and a third conductor 275C leading from a third phase 250C is wound around the core 265 in a third number of turns. The windings of the first number of turns, the windings of the second number of turns, and the winding of the third number of turns are in a non-cancelling arrangement. That is the windings are all wound in a first, common direction (i.e., all clockwise or counterclockwise) and none are wound in a second direction. The number of turns of the first winding, second winding, and third winding are not equal and are based on a ratio; i.e., employ differing turn ratios. For example, the ratio may be a one-to-two-to-four (1:2:4) turn ratio. Other ratios are possible, with preferred ratios being used to minimize harmonics from cancelling. The Hall Effect device 270 monitors all three phases of the high-voltage AC bus. The output of the device 270 is an analog signal, which is analyzed in terms of amplitude, frequency, and amplitude/frequency ratio. These electrical parameters can determine bus loading and identify fault conditions.

Before proceeding further, it should be understood that, when referring to being wound around the core 265, one of the windings may simply pass through the core. This is still considered to be wound around the core even though it simply passes through the core.

Referring to FIG. 6, the exemplary sensor shown is an LEM brand current transducer, Model HAB 40-V, found at www.LEM.com. The Hall Effect device 270 has three ports 275, 280, and 285. The port 275 receives a DC supply voltage, the port 280 is coupled to ground, and the port 285 outputs the analog signal. The analog output signal is provided to the controller 165 for further analysis.

The Hall Effect sensor 260 can be integrated with wound conductors 275 to create a wire harness 290. The wire harness 290 can include the wound conductors 275 that couple with conductors 295 from the alternator 127 at nodes (or junctions) 300. The conductors 275 of the wire harness 290 can couple with conductors 305 leading to the system loads at nodes 310. The wire harness 290 also include nodes 275, 280, and 285 (or ports) as discussed above.

As stated above, the output of the device 270 is an analog signal, which is analyzed in terms of amplitude, frequency, and amplitude/frequency ratio. For example, the analog signal is a voltage having a relationship to the current through the sensor 260. The voltage relates to a composite signal of the current of the three phases. That is, the signal relates to an unequally weighted vector summation of the current for the three phases. The signal will include an amplitude, a frequency, and an amplitude-to-frequency ratio related to the amplitude, frequency, and amplitude-to-frequency ratio of the composite phase currents.

A system like the mobile environmental-control system 105 has known operating conditions for the alternator 127 and loads. When utilizing a load, like the compressor 115, the current should be in a known range. The amplitude of the output signal can be compared to a value representative of a properly operating compressor and if the amplitude is within range, then the control module 165 confirms the system 105 is operating properly. If the amplitude of the output signal is out of range (e.g., greater than a threshold), then the current is too high for the load and the alternator 127 shuts down. The monitored amplitude of the signal can be an RMS value, an averaged value, or a peak value.

Similarly, the alternator 127 should be operating at a known frequency and a known amplitude-to-frequency ratio. The frequency and the amplitude-to-frequency ratio of the output signal can be analyzed to determine whether the alternator 127 is operated properly.

Accordingly, the invention provides, among other things, a new and useful mobile environmental-control system having a magnetic sensor for a high-voltage bus. Various features and advantages of the invention are set forth in the following claims.

What is claimed is:

1. A mobile environment-controlled unit comprising:
   a chassis;
   a compartment supported by the chassis;
   an environmental-control system in environmental communication with the compartment, the environmental-control system being configured to control an environmental parameter of the compartment, the environmental-control system including
      a multiphase alternator powered by an internal combustion engine and to supply electrical power for the environmental-control system, the alternator having a first phase winding to generate a first high-voltage alternating phase current and a second phase winding to generate a second high-voltage alternating phase current;
      a magnetic sensor including
         a core,
         a magnetic sensing device interconnected to the core and providing an output based on a sensed electromagnetic parameter,
         wherein a first conductor leading from the first phase winding is wound around the core in a first direction for a first number of turns, and
         wherein a second conductor leading from the second phase winding is wound around the core in the first direction for a second number of turns, the second number of turns being different from the first number of turns; and
      a controller coupled to the magnetic sensing device and configured to control the environmental-control system based on the output of the magnetic sensing device.

2. The mobile environment-controlled unit of claim 1, wherein the alternator has a third phase winding to generate a third high-voltage alternating phase current, wherein a third conductor leading from the third phase winding is wound around the core in the first direction for a third number of turns, the third number of turns being different from the first number of turns and the second number of turns.

3. The mobile environment-controlled unit of claim 2, wherein the first, second, and third numbers of turns have a 1:2:4 turns ratio relationship.

4. The mobile environment-controlled unit of claim 1, wherein the magnetic sensor includes a Hall-Effect sensor and the magnetic sensing device includes a Hall-Effect device.

5. The mobile environment-controlled unit of claim 1, wherein the Hall Effect sensor is an open loop sensor.

6. The mobile environment-controlled unit of claim 1, wherein the environmental-control system further includes a wire harness including the magnetic sensor.

7. The mobile environment-controlled unit of claim 1, wherein the controller compares an amplitude of the output signal to a value indicative of a fault in the unit.

8. The mobile environment-controlled unit of claim 1, wherein the controller compares a frequency of the output signal to a value indicative of a fault in the unit.

9. The mobile environment-controlled unit of claim 1, wherein the controller compares an amplitude-to-frequency ratio to a value indicative of a fault in the unit.

10. A mobile generator comprising:
    an internal combustion engine;
    a multiphase alternator to be powered by the internal combustion engine and to supply electrical power to the environmental-control system, the alternator having a first phase winding to generate a first high-voltage alternating phase current and a second phase winding to generate a second high-voltage alternating phase current;
    a magnetic sensor including
       a core,
       a magnetic sensing device interconnected to the core and providing an output based on a sensed electromagnetic parameter,
       wherein a first conductor leading from the first phase winding is wound around the core in a first direction for a first number of turns, and
       wherein a second conductor leading from the second phase winding is wound around the core in the first direction for a second number of turns, the second number of turns being different from the first number of turns; and
    a controller coupled to the magnetic sensing device and configured to control the internal combustion engine based on the output of the magnetic sensing device.

11. The mobile generator of claim 10, wherein the alternator has a third phase winding to generate a third high-voltage alternating phase current, wherein a third conductor leading from the third phase winding is wound around the core in the first direction for a third number of turns, the third number of turns being different from the first number of turns and the second number of turns.

12. The mobile generator of claim 11, wherein the first, second, and third numbers of turns have a 1:2:4 turns ratio relationship.

13. The mobile generator of claim 10, wherein the magnetic sensor includes a Hall-Effect sensor and the magnetic sensing device includes a Hall-Effect device.

14. The mobile generator of claim 10, wherein the environmental-control system further includes a wire harness including the magnetic sensor.

15. The mobile generator of claim 10, wherein the controller compares an amplitude of the output signal to a value indicative of a fault in the unit.

16. The mobile generator of claim 10, wherein the controller compares a frequency of the output signal to a value indicative of a fault in the unit.

17. A mobile environment-controlled unit comprising:
a chassis;
a compartment supported by the chassis;
an environmental-control system in environmental communication with the compartment, the environmental-control system being configured to control an environmental parameter of the compartment, the environmental-control system including
a three-phase alternator powered by an internal combustion engine and to supply electrical power for the environmental-control system, the alternator having a first phase winding to generate a first high-voltage alternating phase current, a second phase winding to generate a second high-voltage alternating phase current, and a third phase winding to generate a third high-voltage alternating phase current;
a Hall Effect sensor including
a core,
a Hall Effect device interconnected to the core and providing an output based on a sensed electromagnetic parameter,
wherein a first conductor leading from the first phase winding is wound around the core in a first direction for a first number of turns,
wherein a second conductor leading from the second phase winding is wound around the core in the first direction for a second number of turns, the second number of turns being different from the first number of turns, and
wherein a third conductor leading from the third phase winding is wound around the core in the first direction for a third number of turns, the third number of turns being different from the first number of turns and the second number of turns; and
a controller coupled to the magnetic sensing device and configured to control the environmental-control system based on the output of the magnetic sensing device.

18. The mobile environment-controlled unit of claim 17, wherein the first, second, and third numbers of turns have a 1:2:4 turns ratio relationship.

19. The mobile environment-controlled unit of claim 17, wherein the environmental-control system further includes a wire harness including the Hall Effect sensor.

20. The mobile environment-controlled unit of claim 17, wherein the controller compares an amplitude of the output signal to a value indicative of a fault in the unit, compares a frequency of the output signal to a value indicative of a fault in the unit, and compares an amplitude-to-frequency ratio to a value indicative of a fault in the unit.

\* \* \* \* \*